United States Patent [19]

Goth et al.

[11] Patent Number: 4,549,927
[45] Date of Patent: Oct. 29, 1985

[54] METHOD OF SELECTIVELY EXPOSING THE SIDEWALLS OF A TRENCH AND ITS USE TO THE FORMING OF A METAL SILICIDE SUBSTRATE CONTACT FOR DIELECTRIC FILLED DEEP TRENCH ISOLATED DEVICES

[75] Inventors: George R. Goth; Thomas A. Hansen, Poughkeepsie; James S. Makris, Wappingers Falls, all of N.Y.

[73] Assignee: International Business Machines Corporation, Armonk, N.Y.

[21] Appl. No.: 626,271

[22] Filed: Jun. 29, 1984

[51] Int. Cl.$^4$ .............. H01L 21/306; B44C 1/22; C03C 15/00; C23F 1/02
[52] U.S. Cl. .............. 156/643; 29/576 W; 29/580; 148/187; 156/646; 156/648; 156/649; 156/653; 156/657; 156/659.1; 156/662; 204/192 EC; 204/192 E; 357/49
[58] Field of Search .............. 29/576 W, 580; 357/47–49; 156/643, 646, 648, 649, 653, 657, 659.1, 662; 148/1.5, 187; 204/192 EC, 192 E; 427/88, 93; 252/79.1

[56] References Cited

U.S. PATENT DOCUMENTS

| | | | |
|---|---|---|---|
| 3,381,182 | 4/1968 | Thornton | 317/234 |
| 4,118,728 | 10/1978 | Berry | 357/22 |
| 4,149,177 | 4/1979 | Alter | 357/50 |
| 4,356,622 | 11/1982 | Widmann | 29/571 |

FOREIGN PATENT DOCUMENTS 0029552 11/1980 European Pat. Off. .

OTHER PUBLICATIONS

IBM Technical Disclosure Bulletin, vol. 25, No. 12, May 1983, "Simplified Isolation for an Integrated Circuit" by S. A. Abbas et al. pp. 6611–6614.
IBM Technical Disclosure Bulletin, vol. 25, No. 8, Jan. 1983, "Plasma-Oxide-Filled Deep Dielectric Isolation" by J. S. Basi et al. pp. 4405–4406.
IBM Technical Disclosure Bulletin, vol. 20, No. 11A, Apr. 1978, pp. 4445–4446.
IBM Technical Disclosure Bulletin, vol. 24, No. 12, May 1982, p. 6483.

Primary Examiner—William A. Powell
Attorney, Agent, or Firm—Robert J. Haase

[57] ABSTRACT

Deep trenches (14,15) are formed according to the desired pattern through the N epitaxial layer (13) and N+ subcollector region (12) into the P− substrate (11) of a silicon structure (10). Where a substrate contact is needed, the trenches delineate a central stud (16) or mesa of silicon material. Channel stop regions (18) are formed e.g. by ion implantation of boron atoms at the bottom of trenches, $SiO_2$ and $Si_3N_4$ layers (17,19) are then deposited on the whole structure. A substrate contact mask is applied and patterned to selectively expose one side of the trench sidewalls, the bottom of the trenches adjacent thereto and others areas if desired such as the top surface of the stud. The composite $SiO_2/Si_3N_4$ layer is then etched to leave exposed only the sidewalls of the stud, at least partially the bottom of the trenches adjacent thereto and the top surface of the stud. Platinum is deposited preferably via sputter deposition, conformally coating all regions of the structure. After sintering, the unreacted platinum is removed using wet chemical etch (aqua regia). Platinum silicide is left in all opened contacts and on the stud sidewalls where its defines a metal silicide lining (25) or cap, covering the stud. This lining connects the top surface (25a) of the stud, with the channel stop implanted regions (18) and then forms the desired substrate contact.

23 Claims, 9 Drawing Figures

METHOD OF SELECTIVELY EXPOSING THE SIDEWALLS OF A TRENCH AND ITS USE TO THE FORMING OF A METAL SILICIDE SUBSTRATE CONTACT FOR DIELECTRIC FILLED DEEP TRENCH ISOLATED DEVICES

REFERENCE TO A COPENDING APPLICATION

The present application is related to patent application Ser. No. 626,278 filed concurrently by G. T. Goth, T. A. Hansen and R. T. Villetto for "Metal silicide channel stoppers for integrated circuits and method for making the same".

BACKGROUND OF THE INVENTION

1. Field of Invention

The present invention relates to a method for producing semiconductor devices and more particularly to a method for selectively exposing the sidewalls of a trench and its use in the formation of a metal silicide substrate contact for high density dielectric filled, deep trench isolated semiconductor devices.

2. Brief Description of the Prior Art

A reverse bias is commonly applied to the substrate in a semiconductor integrated chip for isolation purposes. In this case, the potential of the substrate is maintained at an appropriate value, so that the P-N junction of the isolation region and the substrate becomes reverse biased.

Conventional methods for forming a substrate contact for a semiconductor device are well known, such as a method for forming an electrode at the backside of the substrate to which is applied an external bias. With the development of large scale integration, thick and low doped substrates are widely used. Silicon wafers have lightly doped substrates in order to significantly reduce collector-substrate capacitances, which, in turn, increase the operating frequencies of the devices. Unfortunately, when the impurity concentration of the substrate is low, the electrical path between the electrode and the substrate becomes highly resistive, resulting in active devices, such as PNP lateral transistors having poor characteristics. This problem has been eliminated by contacting the substrate, through the N type epitaxial layer, with a highly doped P region. An example of this technique, in combination with standard recessed oxide isolation, may be found in European Patent application bearing the publication number 29552 assigned to VLSI Technology Research Association.

More recent trends in micro-electronics capitalize on a particular type of dielectric isolation where patterns of dielectrically filled trenches, extending from the surface of the integrated circuit to the interior thereof are used to isolate the devices (e.g. one bipolar transistor from another bipolar transistor) or portions (e.g. the base region from the collector region in a bipolar transistor) of the devices.

A method of forming a substrate contact for a trench structure is taught in an article of the IBM Technical Disclosure Bulletin, vol. 25 No. 12, May 1983, pages 6611 through 6614, authored by S. A. Abbas et al. This article describes the formation of a polysilicon buried conductor for reach through to the P substrate for ohmic electrical contact thereto. Once the trenches and channel stoppers have been formed, and trenches protected with an insulating layer, the bottom of the trench, where a contact is needed, is opened to expose the channel stopper. A thin polysilicon layer is CVD deposited, covering the sidewalls in totality and providing a contact with the substrate. It is obvious that with this technique, the P+substrate contact reach through is highly resistive, not suitable for advanced bipolar devices. Also, a parasitic polysilicon-oxide-silicon capacitor is created which will degrade the circuit performance.

A variant is described in U.S. Pat. No. 4,256,514 assigned to the assignee of the present invention. According to this patent, a doped, polysilicon stud is used to provide the electrical contact with the substrate. However, although doped polysilicon still remains a relatively resistive material, and this solution is not completely satisfactory, because it implies the use of wide trenches, completely filled with polysilicon to reduce the resistance of the stud, which in turn results in lower integration density.

In addition, some other problems may result from this solution, due to, firstly different thermal coefficients between polysilicon and silicon, which may lead to undesired cracks in the filled trenches and, secondly, the resulting structure has very poor planarity. Planarity is a must when multilevel metallurgy (e.g. 4) is needed to assure the fan-in, and the fan-out functions of highly integrated circuits.

An other alternate solution is described in "Plasma oxide filled deep dielectric isolation", J. S. Basi et al, IBM Technical Disclosure Bulletin, vol. 25 No. 8, Jan. 1983 pages 4405 and 4406. This article describes a method for forming a buried conductor for reach-through to the P−silicon substrate of a chip from the surface of an epitaxial layer. The substrate contact is made by shorting the subcollector to the P channel stopper, at the bottom of the trenches and then to the top metallurgy via the collector reach through diffusion. The role of the metal is therefore to short the N− epitaxy-P substrate/P+ channel stopper junction.

In this reference (and in the aforementioned U.S. Pat. No. 4,256,514 as well), a part of the electrical path, between the contact and the substrate is made of highly doped silicon material. Therefore, this solution cannot also be considered as fully satisfactory.

It is very important to remark that according to the teachings of this article, an isotropic etch is performed to expose all the sidewalls of a trench. Therefore, all devices adjacent to that trench, will have their N− epitaxy-P− substrate junction shorted by the Pt-Si contact. In others words, all these devices will be only devoted to provide substrate contact and therefore will be lost for logical implementation. This results in a non negligible waste of the silicon surface.

OBJECTS OF THE INVENTION

It is, therefore, a primary object of the invention to provide a method of selectively exposing the sidewalls of the trenches, to allow selective processing (etching, metal deposition . . . ) of the sidewalls which in turn will result in a significant saving of silicon room and therefore will allow a denser design than those obtained in the prior art.

It is another object of the invention to provide a method of selectively exposing the sidewalls of trenches and its use to the forming of a substrate contact for polyimide filled deep trench isolated devices compatible with very narrow trenches therefore considerably increasing integration density.

It is another object of the invention to provide a method of forming a substrate contact for high density polyimide filled deep trench isolated devices, comprised of a metal lining having very low resistance characteristics.

It is still another object of the invention to provide a method of forming a substrate contact for high density polyimide filled deep trench isolated devices which significantly improves the planarity of the structure.

SUMMARY OF THE PRESENT INVENTION

In accordance with the most general concept of the present invention, it is proposed thereafter, a broad method for selectively exposing the sidewalls of a trench. In others words, as a result, one sidewall will be exposed for further processing while the other will remain passivated.

In accordance with a more specific aspect of the present invention, said method will be described thereafter in connection with the forming of a platinum silicide lining by sputter deposition of platinum, on only a part of the sidewall and on the bottom of an isolation trench, for making contact from the surface of the epitaxial layer to the buried substrate.

Deep trenches according to the desired pattern are opened through the N epitaxial layer and N+ subcollector region into the P− substrate of a silicon structure. Where a substrate contact is to be formed, the trenches delineate a central stud or mesa of silicon material. It is generally highly desirable that channel stop regions be formed, e.g. by ion implantation of boron atoms, at the bottom of trenches. $SiO_2$ and $Si_3N_4$ layers are then deposited on the whole structure. A substrate contact mask is applied and patterned to selectively expose the sidewalls, the trenches which correspond to the stud, the bottom of the trenches adjacent thereto, and the top surface of the stud. The composite $SiO_2/Si_3N_4$ layer is etched to leave exposed said sidewalls of the stud, the bottom of the trenches adjacent thereto, and the top surface of the stud. Platinum is deposited preferably via sputter deposition, conformally coating all regions of the wafer. After sintering, the platinum in excess is removed using wet chemical etch (aqua regia). Platinum silicide is left in all opened contacts (bottom of the trenches and top surface of the stud) and on the trench sidewalls where it defines a metal silicide lining or cap, covering at least partly the stud. This lining connects the top surface of the stud with the channel stop implanted regions and thence forms the desired substrate contact. According to standard techniques, polyimide is then applied and appropriately etched to fill the trenches. It is an important point of the invention that the isolation trench provides two functions: first, the classic isolation of the device pocket containing the device (e.g. a NPN transistor) and second, through a continuous low resistive thin metal lining, an access to the buried substrate from the surface.

BRIEF DESCRIPTION OF THE DRAWINGS

In the accompanying drawings forming a material part of the disclosure.

DISCLOSURE OF THE INVENTION

The present invention will be explained with reference to the attached figures.

In the following, the present invention which basically consists of a method of selectively exposing the sidewalls of a trench will be described in detail with reference to a method of forming a metal silicide substrate contact for high density dielectric filled deep trench isolated bipolar semiconductor devices. However, it should be understood that various other embodiments or uses may be set forth. Lastly, it is to be understood that while various dopant, coating and/or masking layers, processing conditions and the like are disclosed herein, the present invention is not limited thereto.

The usual bipolar semiconductor process is followed through the formation of trenches and passivation thereof with a composite $Si_3N_4/SiO_2$ layer.

Figure 1:
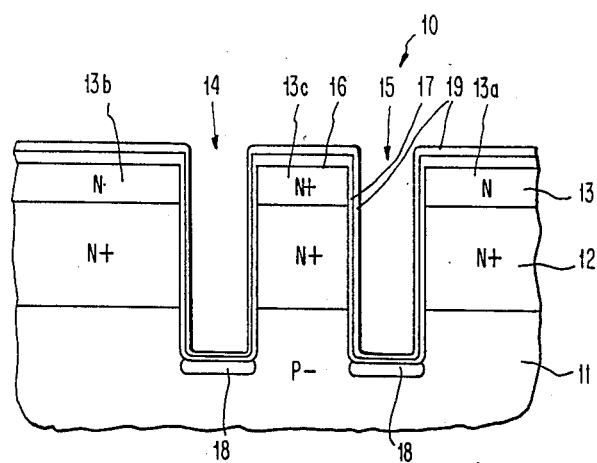
FIGS. 1–9 illustrate cross sectional view of an integrated structure undergoing fabrication according to the method of the present invention.

With reference to FIG. 1, the initial structure 10 is comprised of a P− silicon substrate 11, having a blanket N+ subcollector 12 and N− epitaxial layer 13 thereon.

Deep narrow trenches 14 and 15 have been formed by etching through the N− epitaxial layer 13 and the N+ subcollector 12, into the P− substrate 11. Many well known etching techniques may be employed for the trench formation, such as illustrated in U.S. Pat. No. 4,381,953 to Ho et al or the improved technique subject to pending patent application Ser. No. 566,593 filed on Dec. 29, 1983 "Trench etch process for dielectric isolation", to Goth et al and assigned to the same assignee as the present invention, both are incorporated herein by reference. Trenches are about 6 microns deep and 2 microns wide. The lay out design of the trenches is such that it delineates a square shaped central stud 16 or mesa between trenches 14 and 15, (the other trenches in the orthogonal direction are not represented).

Following trench formation, silicon dioxide is regrown by thermal oxidation, to provide a $SiO_2$ layer 17 of a thickness in the range of 50 to 300 nm.

Then, a standard ion implantation is conducted and boron is introduced at the bottom of the trenches to create channel stoppers 18. An additional layer 19 of $Si_3N_4$ is CVD deposited of the order of 20 to 150 nm thick onto the whole structure. Of course, active devices such as bipolar transistors and/or passive devices have been previously formed in the different isolated epitaxial pockets such as 13a and 13b, but have not been represented for sake of clarity.

However, no devices have been formed in the epitaxial pocket 13c corresponding to the central stud (16).

As will be further apparent to the man skilled in the art, many more deep and narrow trenches forming an isolation pattern have been formed simultaneously with trenches 14 and 15 at the surface of the structure for isolation purposes. It is clear that the structure as shown in FIG. 1 results only from conventional manufacturing techniques.

Figure 2:
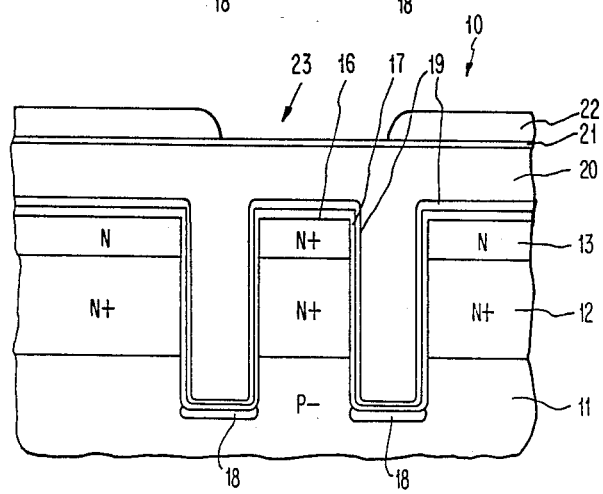

Now, with reference to FIG. 2, an organic underlay material such as polyimide (2.0–4.0 μm thick) is first applied onto the $Si_3N_4$ layer 19 by spin coating to form layer 20. An inorganic barrier layer 21, for example $SiO_x$, with a thickness in the 100 to 300 nm range is subsequently deposited in a CVD plasma. Polyimide is preferred over photoresist because it fills trenches without voids, is optically transparent, therefore allowing precise mask alignment, and lastly is thermally stable during deposition of the barrier layer. This step is followed by the application of a conventional photoresist such AZ 1350J (a trade name of Shipley Company), by spin coating. The photoresist layer 22, is exposed according to a desired pattern to ultraviolet light through a mask (not represented) and subsequently developed, in a conventional manner. The imaging layer 22 of photoresist is typically 0.7–1.5 μm thick to optimize exposed image quality. It is important in our particular embodiment that the opening 23 in the imaging photoresist layer 22 be wider than the square shaped stud as apparent from FIG. 2. This will assure subsequently that the desired portions of the stud sidewalls, the bottom of the trenches adjacent thereto and the top surface of the stud be exposed.

Figure 4:
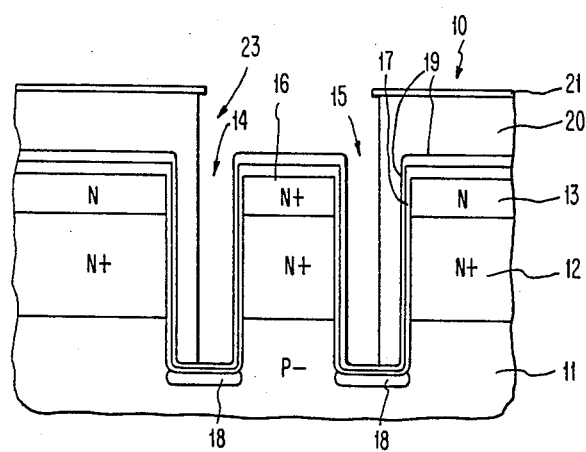
Figure 5:
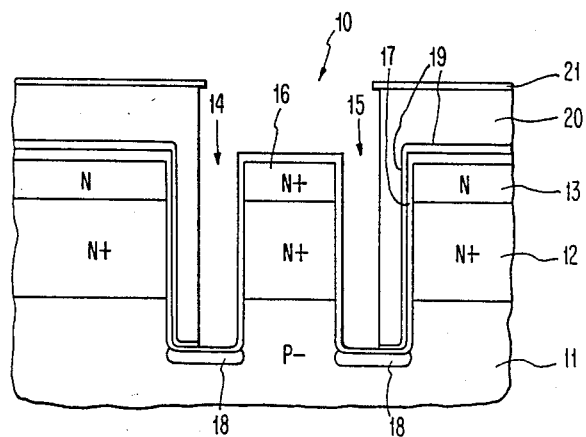

The steps described with reference to FIGS. 3 to 5 following, are typically performed in-situ in a parallel plate reactive ion etch tool.

Etching of the exposed area of the inorganic barrier layer 21 is accomplished using $CF_4$. Over-etch of 50–100% of the barrier layer is used to assure complete removal in the exposed regions.

| Typical etch parameters are: | |
| --- | --- |
| Power density | 0.24 watts/cm$^2$ |
| Flow (CF$_4$) | 30 Scc/min. (S stands for Standard) |
| Pressure | 40 μm |
| Etch rate SiO$_x$ | 45 nm/min. |
| Etch rate Polymide | 32.5 nm/min. |

Figure 3:
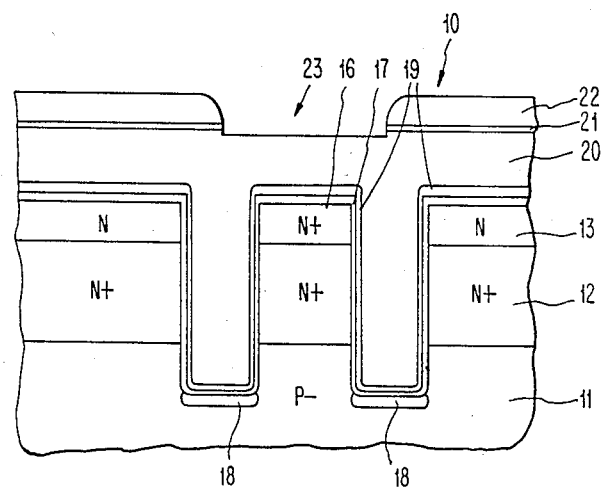

The resulting structure is shown in FIG. 3. The removed portion of the inorganic barrier layer correspond to opening 23 of the imaging photoresist layer 22.

The reactive ion etch of the organic underlay 20 is accomplished in an $O_2$ ambient in preferably a two step process for reasons explained thereafter. First the under lay material is etched to the bottom of the trench under complete anisotropic conditions as follows:

| Power density | 0.17 watts/cm$^2$ |
| --- | --- |
| Pressure | 3 μm |
| Flow O$_2$ | 100 Scc/min. |
| Etch rate SiO$_x$ | .7 nm/min. |
| Etch rate Polymide | 75 nm/min. |

Selectivity of $\approx$100:1 is achieved which permits full removal of 8–10 μm of polyimide with minor erosion ($\sim$100 nm) of the SiO$_x$ barrier layer 21. The second step of the process aims to perform a sidewall clean, to remove retained under lay material where trench sidewalls have negative slopes. Total layer removal is 100–300 nm thick. Etching conditions read as follows:

| Power density | 0.23 watts/cm$^2$ |
| --- | --- |
| Pressure | 50 μm |
| Flow O$_2$ | 30 Scc/min |
| Etch rate Polymide | 200 nm/min. |

The under-cut of the barrier layer 21 which defines now opening 23, is the result of the sidewall clean step.

The remaining portions of the resist layer 22 are eliminated, when the exposed organic underlay layer is RIE etched in the O$_2$ plasma, leaving unprotected only the central stud 16 and a significant portion of the bottom of the trenches, which is contiguous to the sidewalls of said central stud.

As previously mentioned, etching of the exposed portions of the Si$_3$N$_4$ layer 19 is performed in-situ following the barrier and underlay etch steps. The etch process is "semi isotropic" when etched in a parallel plate reactive ion etch tool as follows:

| Power density | 0.23 watts/cm$^2$ |
| --- | --- |
| Pressure | 200 μm |
| Flow (CF$_4$ + 10% O$_2$) | 150 Scc/min. |
| Etch rate Si$_3$N$_4$ | 70 nm/min. |
| Etch rate SiO$_2$ | 40 nm/min. |
| Etch rate Polymide | 45 nm/min. |

This process step is particularly important. Fully isotropic Si$_3$N$_4$ etch processes are not workable in this structure because mechanical stresses in the organic underlay result in separation of the underlay from the Si$_3$N$_4$ trench liner. Isotropic processes result in etch extensions beyond the defined image in the underlay. The underlying thermal SiO$_2$ layer serves as an etch stop to prevent attack of the silicon. The resulting structure is shown in FIG. 5.

Figure 6:
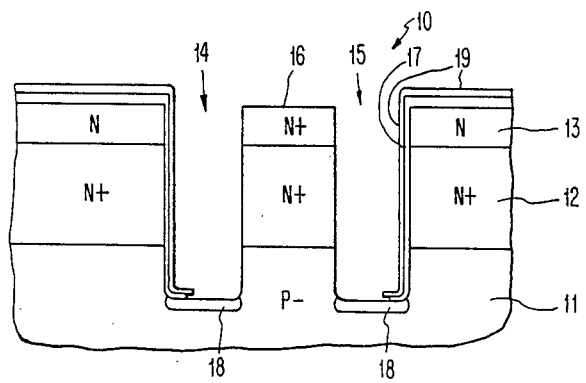

Now turning to FIG. 6, the barrier layer 21 of SiO$_x$ is stripped in a solution of 10:1 H$_2$O:HF which removes SiO$_X$ ~5x faster than than thermally grown SiO$_2$ constituting layer 17. The underlay 20 is then stripped using conventional O$_2$ ash processes in a barrel type plasma etcher. The exposed portions of the thermal SiO$_2$ layer 17 are finally etched using a buffer HF solution while the remaining portions of the Si$_3$N$_4$ over-coat layer 19 serve as a mask for this step. This completes the sidewall imaging process which selectively exposes the sidewalls and bottoms of trenches 14 and 15 encompassing the central stud. As a result, only the central stud sidewalls, the portions of the bottom of the trenches which are adjacent to it and the top surface of the stud, are now exposed and ready for further processing.

A thin layer 24 of an appropriate contact metal is blanket deposited on the whole structure by sputter deposition. A silicide forming metal selected in the group comprised of platinum, palladium and the like, is selected. The preferred metal with a thickness in the range of 30–100 nm is platinum.

Figure 7:
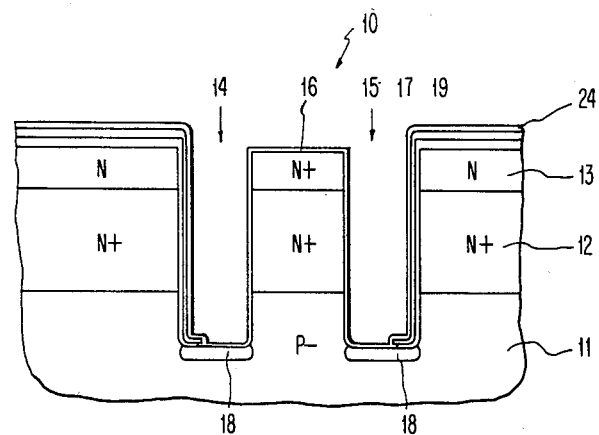

Sputter deposition is the preferred method because unlike others techniques such vacuum evaporation, the metal is deposited on both horizontal and vertical surfaces of the structure. In others words, metal will coat conformally all the exposed regions of the structure. FIG. 7 illustrates the structure at this stage.

Figure 8:
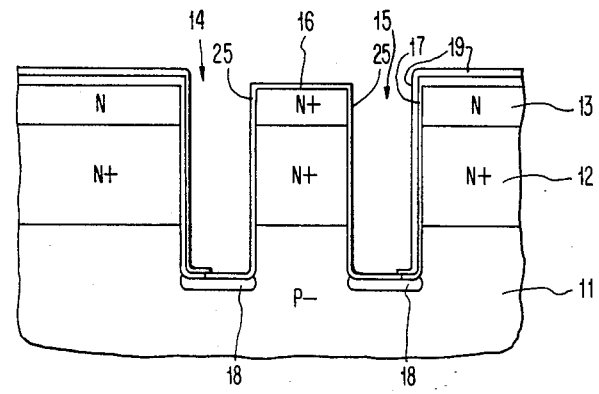

The structure is then heated at about 550° C. to produce a platinum silicide layer 25 by sintering wherever the platinum layer 24 contacts silicon. Unreacted platinum is removed by wet etching (in aqua regia). FIG. 8 shows the result of such a process wherein a platinum silicide contact is formed with the channel stoppers 18 at the bottom of the trenches, and with all the horizontal and vertical surfaces of the stud, forming a metallic lining or cap 25 which completely covers the silicon stud 16 and providing a buried ohmic contact with the P$^-$ substrate 11 through channel stoppers 18.

Figure 9:
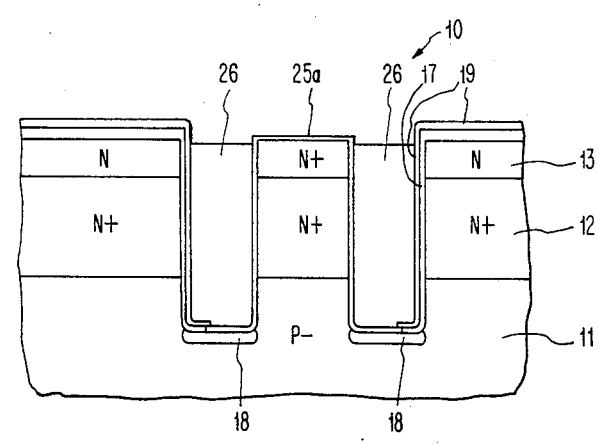

Polymide material 26 is spin applied to fill the trenches. It is baked out at 400° C. and reactive ion etched in an O$_2$ plasma as seen in FIG. 9. The horizontal portion of the Pt-Si layer which remains exposed (see numeral reference 25a) will be used as the substrate contact for the subsequent metallization steps.

Electrical contacts are then made to the elements such as NPN transistors, diodes, resistors . . . in addition to that substrate contact by conventional deposition, lithography and etching techniques.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. In a process of forming semiconductor devices in a semiconductor structure according to which a passivated trench is produced in the structure, the improvement comprising the steps of:

depositing an underlay material to form an underlay layer to coat the structure and fill the trench;

depositing a barrier layer above said underlay layer;

patterning said barrier layer to form at least one opening which overlaps only partially the structure and the trench area, delineating the desired portions of the sidewalls, of the bottom of the trench and of the top surface of the structure, adjacent thereto, to be exposed;

anisotropically etching the underlay material which is exposed through said opening, thereby selectively exposing said desired portions for further processing.

2. The process of claim 1 wherein said underlay material is an organic material.

3. The process of claim 2 wherein said barrier layer is an inorganic material such as $SiO_x$.

4. The process of claim 3 wherein said step of patterning includes a conventional photolithographic step with an overetching of the barrier layer to ensure its complete removal in the exposed region.

5. The process of claim 4 wherein said step of completely etching the underlay material is effected in a parallel plate reactive ion etch tool in an $O_2$ plasma.

6. The process of claim 5 wherein said etch step is a two step process, comprised of a first anisotropic etch, to remove the underlay material to the bottom of the trench, then a cleaning step to remove retained underlay material where sidewalls have negative slopes, the latter step is accomplished at a higher pressure.

7. The process of claim 6 wherein said two-step process operating condition read as follows:

| (1) Power density | 0.17 watts/cm$^2$ |
|---|---|
| Pressure | 3 μm |
| Flow | 100 Scc/min. |
| Etch rate SiO$_x$ | .7 nm/min. |
| Etch rate polyimide | 75 nm/min. |
| (2) Power density | 0.23 watts/cm$^2$ |
| Pressure | 50 μm |
| Flow (O$_2$) | 30 Scc/min. |
| Etch rate polyimide | 200 nm/min. |

8. The process of claim 1 wherein said trench is passivated by a composite $SiO_2/Si_3N_4$ layer.

9. The process of claim 8 wherein the exposed areas of the $Si_3N_4$ layer forming part of said composite masking layer are removed to expose the underlying $SiO_2$ layer.

10. The process of claim 9 wherein said removal is accomplished in a $CF_4 + 10\%$ $O_2$ plasma, in semi isotropic etching conditions.

11. The process of claim 10 wherein said conditions reads as follows:

| Power density | 0.23 watts/cm$^2$ |
|---|---|
| Pressure | 200 μm |
| Flow (CF$_4$ + 10% O$_2$) | 150 Scc/min. |
| Etch rate Si$_3$N$_4$ | 70 nm/min. |
| Etch rate SiO$_2$ | 40 nm/min. |
| Etch rate polyimide | 45 nm/min. |

12. The process of claim 11 wherein the remaining portions of the barrier layer are removed in a 10:1H$_2$O:HF solution.

13. The process of claim 12 wherein the remaining portions of the underlay layer are removed using conventional ash processes in a barrel type barrel etcher.

14. The process of claim 13 wherein the exposed portions of the SiO$_2$ layer are removed in a buffer HF solution.

15. The process of claim 14 wherein said trench is part of a pattern of isolation trenches to isolate devices or part of devices.

16. The process of claim 15 wherein said structure is comprised of a P$^-$ silicon substrate having a N$^+$ subcollector and N epitaxial layer thereon, and said trenches are formed through said subcollector and epitaxial layer into said substrate.

17. The process of claim 15 wherein the bottom of said trenches is provided with channel stopper region.

18. The process of claim 17 wherein said pattern of trenches defines a central stud of silicon having all its sidewalls, the bottoms of trenches adjacent thereto and its top surface exposed.

19. The process of claim 18 further comprising the steps of:

blanket depositing a layer of a silicide forming metal;

sintering the structure to produce metal silicide wherever said metal contacts silicon; and, removing the unreacted metal, leaving a metal silicide cap covering the stud and channel stopper regions, therefore providing an electrical contact between the top side of the structure and the substrate.

20. The process of claim 19 wherein said depositing step is accomplished by sputtering.

21. The process of claim 20 wherein said metal is selected in the group comprised of platinum and palladium.

22. The process of claim 21 further comprising the step of filling the trenches with polyimide and reactively ion etching in an O$_2$ plasma the polyimide in excess to let exposed the top part of said metal silicide cap to be used as a substrate contact.

23. The process of any of the preceding claims wherein said underlay material is an organic material selected from the polyimide group.

* * * * *